United States Patent [19]
Yano et al.

[11] Patent Number: 5,107,141
[45] Date of Patent: Apr. 21, 1992

[54] BICMOS LOGIC CIRCUIT USING 0.5 MICRON TECHNOLOGY AND HAVING AN OPERATING POTENTIAL DIFFERENCE OF LESS THAN 4 VOLTS

[75] Inventors: Kazuo Yano, Nino; Mitsuru Hiraki, Hachioji; Hisayuki Higuchi, Kokubunji; Suguru Tachibana, Hachioji; Makoto Suzuki, Niiza; Katsuhiro Shimohigashi, Musashimurayama, all of Japan

[73] Assignee: Hitachi, Ltd., Tokyo, Japan

[21] Appl. No.: 604,454

[22] Filed: Oct. 29, 1990

[30] Foreign Application Priority Data

Nov. 1, 1989 [JP] Japan .................................. 1-282964
Jun. 18, 1990 [JP] Japan .................................. 2-157503

[51] Int. Cl.⁵ .................... H03K 19/094; H03K 17/16
[52] U.S. Cl. ........................... 307/446; 307/448; 307/451; 307/570; 307/576
[58] Field of Search ............... 307/443, 446, 448, 451, 307/570, 576

[56] References Cited

U.S. PATENT DOCUMENTS

| | | | |
|---|---|---|---|
| 4,719,373 | 1/1988 | Masuda et al. | 307/446 |
| 4,880,998 | 11/1989 | Ueda | 307/446 |
| 4,890,017 | 12/1989 | Masuda et al. | 307/446 |

FOREIGN PATENT DOCUMENTS

| | | | |
|---|---|---|---|
| 0132822 | 7/1984 | European Pat. Off. | 307/446 |
| 57-11671 | 1/1984 | Japan. | |

OTHER PUBLICATIONS

"0.5 Micron BiCMOS Technology", Momose et al., Circuit Technology R & D Hewlett-Packard Company, 1987 IEEE.
K. Momose et al., "0.5 Micron BICMOS Technology", 1987 IEDM (IEEE-Int'l Electron Devices Meeting), pp. 838-840.
A. Watanabe et al., "Future BiCMOS Technology for Scaled Supply Voltage", 1989.
IEDM (IEEE-Int'l Electron Devices Meeting), pp. 429-432, Dec. 3-6, 1989.
H. Shin et al., "Full-Swing Complementary BiCMOS Logic Circuits", (Proc. 1989 IEEE Bipolar Circuits and Technology Meeting, Sep. 1989), pp. 229-232.
K. Natori et al., "A 34ns 256K DRAM", 1983 IEEE—Int'l Solid State Circuit Conf., Dig. of Technical Papers, pp. 232-233, 2/25/1983.
K. Itoh et al., "An Experimental 1Mb DRAM with On-Chip Voltage Limiter", 1984 IEEE-ISSCC (Dig. of Tech. Papers), pp. 282-283, 2/24/1984.
S. Kohyama et al., "Directions in CMOS Technology", 1983 IEDM (IEEE-Int'l Electron Devices Meeting), pp. 151-154.

*Primary Examiner*—Stanley D. Miller
*Assistant Examiner*—Margaret Rose Wambach
*Attorney, Agent, or Firm*—Antonelli, Terry, Stout & Kraus

[57] ABSTRACT

An output circuit portion of a BiCMOS logic circuit adapted to operating on a low voltage has an npn transistor Q5 connected between the power source Vcc and an output N6, and has an npn transistor Q6 connected between the output N6 and ground potential GND. The base of the npn transistor Q5 is driven by the drain output of p-channel MOSFETs MP3, MP4, and the base of the npn transistor Q6 is driven by the drain output of p-channel MOSFET QP5. When the power source voltage Vcc drops, the voltage applied between the drain and the source of MOSFET MP5 becomes small by the effect of $V_{BE}$ of the transistor Q6, but the drain current of the MOSFET MP5 changes little. Therefore, the BiCMOS circuit operates at high speeds (see FIG. 1) even when the power source voltage drops.

17 Claims, 10 Drawing Sheets

2 INPUT NAND

FIG. 13(B)

PULL-DOWN PORTION

BICMOS LOGIC CIRCUIT USING 0.5 MICRON TECHNOLOGY AND HAVING AN OPERATING POTENTIAL DIFFERENCE OF LESS THAN 4 VOLTS

BACKGROUND OF THE INVENTION

1. Field of the Invention

The present invention relates to a logic circuit which is based on the combination of CMOS and bipolar transistors, and which operates at high speeds consuming reduced amount of electric power. In particular, the invention relates to a logic circuit for integrated circuits employing a fine working of smaller than 0.5 microns and a power source voltage of smaller than 4 volts.

2. Description of the Prior Art

High-speed low-power logic circuits based on the combination of a bipolar and CMOS transistors have recently been drawing great attention as effective means for increasing the operating speed of integrated circuits. A conventional BiCMOS circuit has been discussed in H. Momose et al., IEEE ELECTRON DEVICE MEETING, 1987, pp. 838–840. A two-input NAND circuit using the conventional BiCMOS is shown in FIG. 2. A pertinent device of this kind has been disclosed in Japanese Patent Laid-Open No. 8431/1984 and its circuit diagram is shown in FIG. 9.

SUMMARY OF THE INVENTION

The BiCMOS logic circuits have heretofore been operated on a standard power supply voltage of 5 volts. At present where fine working technology has advanced to be capable of fabricating integrated circuits with a gate length of smaller than 0.5 microns, however, it is strongly desired to provide a device that operates on a power source voltage of smaller than 5 volts. This is to prevent the element from being deteriorated by hot carriers of the MOSFET as well as to decrease the consumption of electric power.

With the conventional BiCMOS logic circuit, however, the operation speed becomes very slow when the power source voltage is smaller than 4 volts, and advantage over the CMOS is lost or the operation speed becomes slower than that of the CMOS to lose practicability. However, no circuit has yet been proposed to solve these problems, and some experts point out that the future fine integrated circuits may put the BiCMOS circuits out of their use. In other words, it means that if a new BiCMOS circuit capable of operating on a low voltage were invented, a very high industrial value results.

First, described below with reference to FIG. 2 is the reason why the traditional BiCMOS circuit is not suited for low-voltage operation.

In the existing BiCMOS circuit as shown in FIG. 2, npn bipolar transistor Q2 and n-channel MOSFETs MN3, MN4 are used to form a circuit for electrically discharging an output terminal N3. Referring to FIG. 2, considered below is the case where a node N2 to which a signal is input changes from the low into high and, hence, an output terminal N3 changes from high into low.

At this moment, if the node N2 is electrically charged by the BiCMOS circuit of the same kind (i.e., electrically charged by a transistor Q3), the potential at the node N2 rises to a high level that is lower than the power source voltage Vcc by an on-voltage $V_{BE}$ across the base and the emitter of the transistor Q3. In order for the bipolar transistor Q2 to operate, furthermore, the node N1 must assume a potential which is higher than ground potential by $V_{BE}$ only. Under the operation condition, therefore, $Vcc - 2V_{BE}$ is the maximum voltage applied between the gate and the source of the MOSFET MN4. Since the voltage $V_{BE}$ is about 1 volt, the voltage $Vcc - 2V_{BE}$ is about $Vcc - 2$ volts.

FIG. 3 shows the dependency of drain current of the MOSFET upon the gate-source voltage, from which it is obvious that the drain current of the MOSFET MN4 in the circuit of FIG. 2 greatly decreases being affected by $V_{BE}$ and the operation speed of the circuit becomes slow. As the power source voltage Vcc decreases, $V_{BE}$ becomes great relative to Vcc, and the effect due to the decrease in the drain current becomes conspicuous. This is the reason why the operation of the conventional BiCMOS circuit becomes slow with a decrease in the voltage.

Even in the conventional circuit shown in FIG. 9, p-channel MOSFETs MP20, MP21 and MP22 are used to electrically charge the bases of bipolar transistors Q13 and Q14. This circuit, however, is not adapted to being operated on low voltages since the high level at the output terminal N21 becomes lower than the power source voltage Vcc by the on-voltage $V_{BE}$ of the bipolar transistor Q13 that electrically charges the output node.

Speed performance of the conventional circuit of FIG. 9 on low power source voltages has not so far been studied in detail.

It was also found by the present inventors that in the conventional circuit constitution of FIG. 9, there is no path for releasing the base charge of the transistor Q14 after the completion of the discharging operation of the transistor Q14 that discharges the output node N21. When an input signal changes within a short period of time, therefore, a large crossover current flows through the transistors Q13 and Q14 to interrupt the high-speed operation. Moreover, consumption of electric power greatly increases.

The present invention was accomplished based upon the aforementioned study conducted by the present inventors, and its object is to provide a BiCMOS logic circuit which is adapted to being highly densely integrated and which operates at high speeds even on a power source voltage of smaller than 4 volts.

In order to achieve the above-mentioned object according to an embodiment of the present invention, there is provided a logic circuit comprising:

a first npn transistor (Q5) of which the collector-emitter path is connected between a first operating potential (Vcc) and an output terminal (N6); and a second npn transistor (Q6) of which the collector-emitter path is connected between said output terminal (N6) and a second operating potential (GND);

wherein a voltage difference applied between said first operating potential (Vcc) and said second operating potential (GND) is set to be smaller than 4 volts;

a first switching circuit constituted by a p-channel insulated gate FET (MP3, MP4) is connected between said first operating potential (Vcc) and the base of said first npn transistor (Q5);

a second switching circuit constituted by a p-channel insulated gate FET (QP5) is connected between said output terminal (N6) and the base of said second npn transistor (Q6); and said p-channel insulated gate FETs (MP3, MP4, QP5) constituting said first switching circuit and said second switching circuit have gate lengths shorter than 0.5 micron.

According to a preferred embodiment of the present invention, a resistor (R1) or a similar circuit element that equivalently operates as a resistor is connected between the base and the emitter of the first npn transistor (Q5) (see FIG. 1).

According to a preferred embodiment of the present invention, a third switching circuit constituted by a p-channel insulated gate FET (MP8, MP9) is connected between said first operating potential (Vcc) and the gate of said p-channel insulated gate FET (MP10) that constitutes said second switching circuit, and the gate width of said p-channel insulated gate FET (MP8, MP9) constituting said third switching circuit is set to be smaller than the gate width of said p-channel insulated gate FET (MP6, MP7) that constitutes said first switching circuit (see FIG. 6).

According to a preferred embodiment of the present invention, furthermore, a resistor (R2) or a similar circuit element that equivalently operates as a resistor is connected between the base of said second npn transistor (Q6) and said second operating potential (GND) (FIG. 1).

In order to achieve the above-mentioned object according to another embodiment of the present invention, there is provided a logic circuit comprising:

a first npn transistor (Q15) of which the emitter-collector path is connected between a first operating potential (Vcc) and an output terminal (N24); and a second npn transistor (Q16) of which the emitter-collector path is connected between said output terminal (N24) and a second operating potential (GND);

wherein a first switching circuit constituted by a p-channel insulated gate FET (MP23, MP24) is connected between said first operating potential (Vcc) and the base of said first npn transistor (Q15);

provision is made of a first p-channel insulated gate FET (MP 26) for electrically charging the base terminal of said second npn transistor (Q16) to a high level; and the source-drain path of an n-channel insulated gate FET (MN24, MN25) constituting a second switching circuit is connected between the gate terminal of said first p-channel insulated gate FET (MP26) and said second operating potential (GND) (see FIG. 10), and the base of said first npn transistor and the gate of said first p-channel insulated gate FET are insulated from each other or are connected together via any one of a diode, a resistor or a similar circuit element (see FIG. 13(B)).

According to a further embodiment of the present invention, there is provided a logic circuit comprising:

a first npn transistor (Q19) of which the emitter-collector path is connected between a first operating potential (Vcc) and an output terminal (N33); and a second npn transistor (Q20) of which the emitter-collector path is connected between said output terminal (N33) and a second operating potential (GND);

wherein a first switching circuit constituted by a p-channel insulated gate FET (MP34, MP35) is connected between said first operating potential (Vcc) and the base of said first npn transistor (Q19);

provision is made of a first p-channel insulated gate FET (MP39) that electrically charges the base terminal of said second npn transistor (Q20) to a high level;

the source-drain path of an n-channel insulated gate FET (MN34, MN35) constituting a second switching circuit is connected between the gate of said first p-channel insulated gate FET (MP39) and said second operating potential (GND); and the source-drain path of a p-channel insulated gate FET (MP38) constituting a third switching circuit is connected between said first switching circuit and the base of said first npn transistor, and the gate of the p-channel insulated gate FET (MP38) constituting said third switching circuit responds to a signal of said output terminal (N33) (FIG. 12).

According to a preferred embodiment of the present invention, the source-drain path of another p-channel insulated gate FET (MP37) is connected in parallel with the source-drain path of said p-channel insulated gate FET (MP38) that constitutes said third switching circuit, and the gate of said another p-channel insulated gate FET (MP37) responds to an inverted signal of said output terminal (N33) (FIG. 12).

According to a representative embodiment of the present invention (FIG. 1), the base of the first npn bipolar transistor (Q15) for electrically charging the output node is driven by a drain output signal of the p-channel MOSFET (MP3, MP4), and the base of the second npn bipolar transistor (Q6) that discharges the output node is driven by a drain output signal of the p-channel MOSFET (MP5).

When the power source voltage (Vcc) is lowered, on the other hand, the voltage applied across the drain and the source of the p-channel MOSFET (MP5) decreases being affected by $V_{BE}$ of the npn bipolar transistor (Q6) that discharges the output node. As shown in FIG. 4, however, the drain current of the MOSFET changes little even when the drain-source voltage is decreased by $V_{BE}$. According to the representative embodiment of the present invention as mentioned above, the circuit operates at high speeds even when the power source voltage is lowered. According to the representative embodiment of the present invention, the circuit operates at high speeds even on a power source voltage of smaller than 4 volts on which the conventional BiCMOS gate circuits are not capable of operating. Therefore, the consumption of electric power can be greatly decreased.

Other objects and features of the present invention will become obvious from the following embodiments.

BRIEF DESCRIPTION OF THE DRAWINGS

FIGS. 13(A), 13(B), 13(C) and 13(D) are diagrams illustrating the two-input NAND gate of the embodiment of the invention by dividing it into a logic portion, a pull-up portion and a pull-down portion.

DESCRIPTION OF THE PREFERRED EMBODIMENTS

Figure 1:
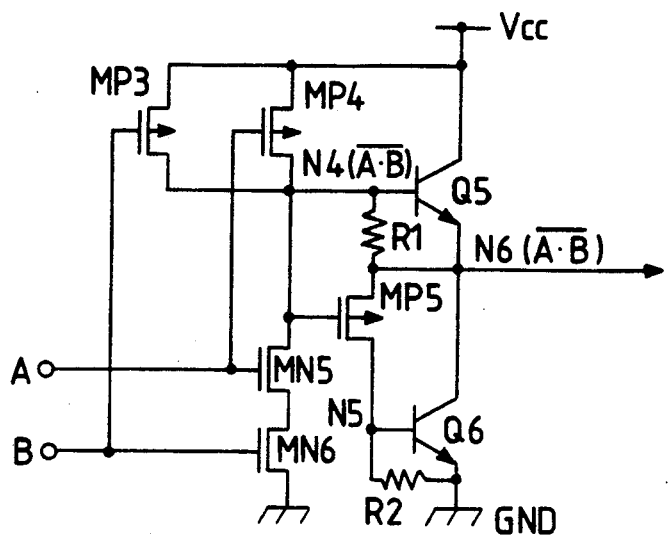
FIG. 1 is a circuit diagram of a two-input NAND gate according to a first embodiment of the present invention.

In the embodiments of the present invention that will be described below, the diagramed n-channel MOSFETs and p-channel MOSFETs have gate lengths that are all shorter than 0.5 microns, and the circuit of each of the embodiments is integrated in a highly densely packaged BiCMOS semiconductor integrated circuit. Further, the power source voltage Vcc has been set to be smaller than 4 volts in each of the embodiments. The power source voltage is set by either one of the following methods.

When an external power source voltage of greater than 4 volts (e.g., about 5 volts) is to be supplied to the chip of BiCMOS semiconductor integrated circuit from outside the chip, an internal power source circuit is arranged in the chip to generate a power source voltage Vcc of smaller than 4 volts from the external power source voltage of greater than 4 volts, and the power source voltage Vcc of smaller than 4 volts is directly supplied to the circuit of each of the embodiments.

On the other hand, when a stable external power source voltage of smaller than 4 volts is supplied to the chip of BiCMOS semiconductor integrated circuit from outside the chip, there is no need of providing an internal power source circuit in the chip and the stably supplied external power source voltage is fed as a power source voltage Vcc to the circuit of each of the embodiments.

EMBODIMENT 1

An embodiment of the present invention will now be described in conjunction with FIG. 1 which illustrates a two-input NAND gate circuit of the present invention that is capable of operating at high speeds on a low power source voltage.

Symbols A and B denote input signals to the NAND gate, MN5 and MN6 denote n-channel MOSFETS, MP3 and MP4 denote p-channel MOSFETS, Q5 and Q6 denote npn bipolar transistors, and R1 and R2 denote resistors.

First, basic logical operation of the embodiment will be described. The MOSFETs MN5, 6 and MP3, 4 constitute a CMOS NAND circuit, and a NAND signal of the inputs A and B is output from a node N4. When the node N4 has a high potential, the bipolar transistor Q5 is turned on, the MP5 is turned off, and a node N5 assumes ground potential. Therefore, the bipolar transistor Q6 remains turned off. When the bipolar transistor Q5 is turned on, therefore, the output node N6 is electrically charged up to a level $Vcc - V_{BE}$. Due to the resistor R1, thereafter, the output node N6 is charged to a high level which is equal to the power source voltage Vcc. When the charging is completed, the transistors Q5, Q6, MP5 are turned off, and the currents flowing into Q5 and Q6 are leakage currents that are almost zero.

As the node N4 changes from high to low, the bipolar transistor Q5 is turned off, the p-channel MOSFET MP5 is turned on to charge the base potential N5 of the bipolar transistor Q6 which is then turned on. Therefore, the electric charge at the output terminal N6 is discharged through Q6 and the terminal N6 assumes the low level. Then, the base charge of Q6 is released through the resistor R2. When the discharge is completed, the transistors Q5, Q6 and MP are finally turned off. The currents flowing into Q5 and Q6 are leakage currents which are almost zero.

As described above, the node N6 becomes high when the node N4 has the high level, the node N6 becomes low when the node N4 has the low level, and the output N6 produces a NAND signal of the inputs A and B. When the input or output level is maintained high or low, furthermore, there flow leakage currents only; i.e., currents flow transiently only when the input is switched. Therefore, the consumption of electric power is as small as that of CMOS. The ability for driving the capacitive load $C_L$ at the output N6 is determined by the bipolar transistors Q5 and Q6, and is very superior to that of the CMOS. Therefore, the circuit still operates at sufficiently high speeds even when the output N6 has a large capacitive load $C_L$.

Figure 4:
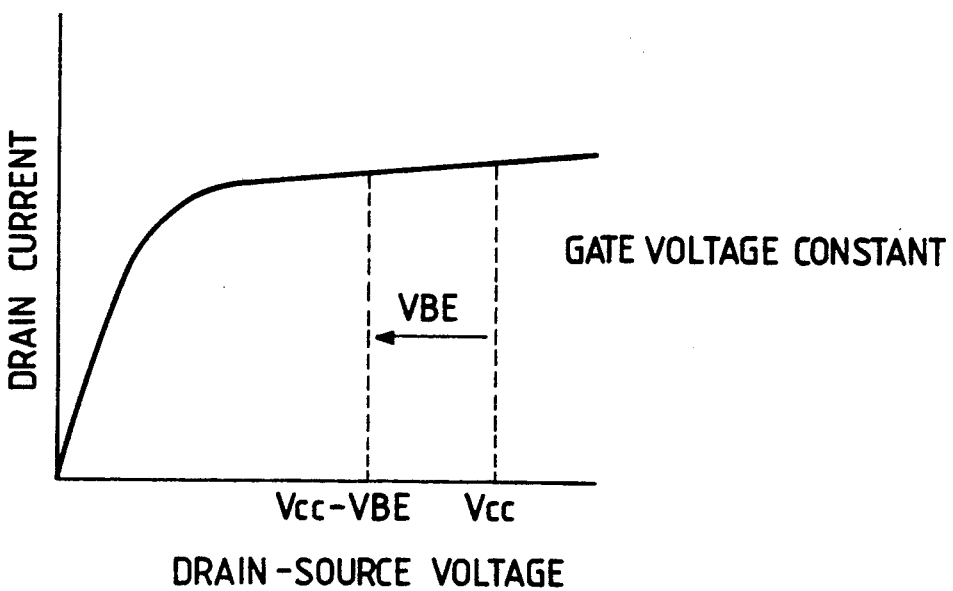
FIG. 4 is a diagram of characteristics showing the dependency of drain current of the MOSFET upon the drain-source voltage.

Described below is the operation of the present invention on a low power source voltage. The MOSFETs MN5, 6, MP3, 4 operate with input amplitudes and output amplitudes similar to those of the ordinary CMOS, and their dependency of operation speed upon the voltage is nearly the same as that of the CMOS. The node N4 changes from high to low, i.e., changes from Vcc to ground potential. The source terminal N6 of MP5 has Vcc due to the resistor R1 up to a moment just before the node N4 changes. When the node N4 suddenly changes to low, a voltage of a maximum of Vcc (absolute value) is applied between the gate and the source of MP5. This means that a voltage is applied to MP5 which is nearly equal to the voltage that is applied across the gate and the source of p-channel MOSFET in the CMOS gate. Thereafter, the node N5 is electrically charged via MP5 and the bipolar transistor Q6 is turned on. At this moment, the node N5 assumes a potential which is higher than ground potential by about the on-voltage $V_{BE}$ of the transistor Q6. Therefore, the voltage (absolute value) across the drain and the source of MP5 becomes $Vcc - V_{BE}$ at the greatest. As shown in FIG. 4, however, the drain current of the MOSFET changes very little in the saturated region even when the voltage decreases across the drain and the source, and a drop of drain-source voltage by the amount of $V_{BE}$ little affects the operation speed.

Due to the resistor R2, an electric charge is stored in the base of the bipolar transistor Q6 only during the period of transient operation in which Q6 is turned on. In other periods, the base charge is discharged through the resistor R2. Therefore, even when the input signal changes in a short period, the circuit operates normally. When there is no resistor R2, a change in the input signal in a short period causes a large crossover current to flow through the transistors Q5 and Q6, and the circuit becomes no more capable of operating at high speeds and the consumption of electric power increases, too.

Figure 2:
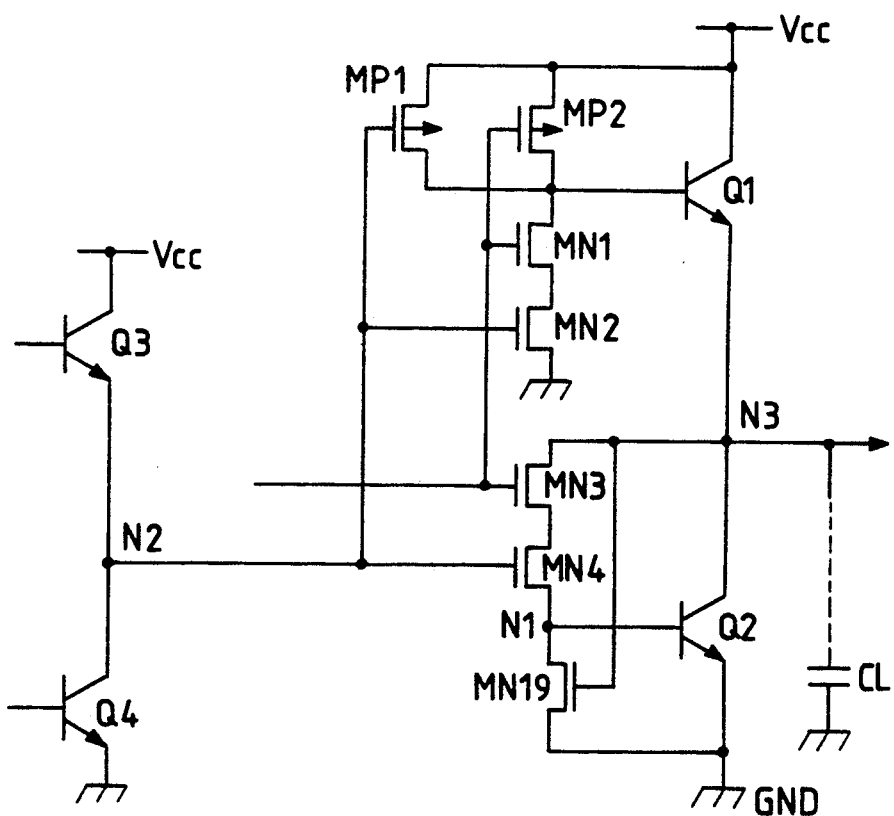
FIG. 2 is a circuit diagram of a two-input NAND gate based on a conventional BiCMOS circuit.
Figure 3:
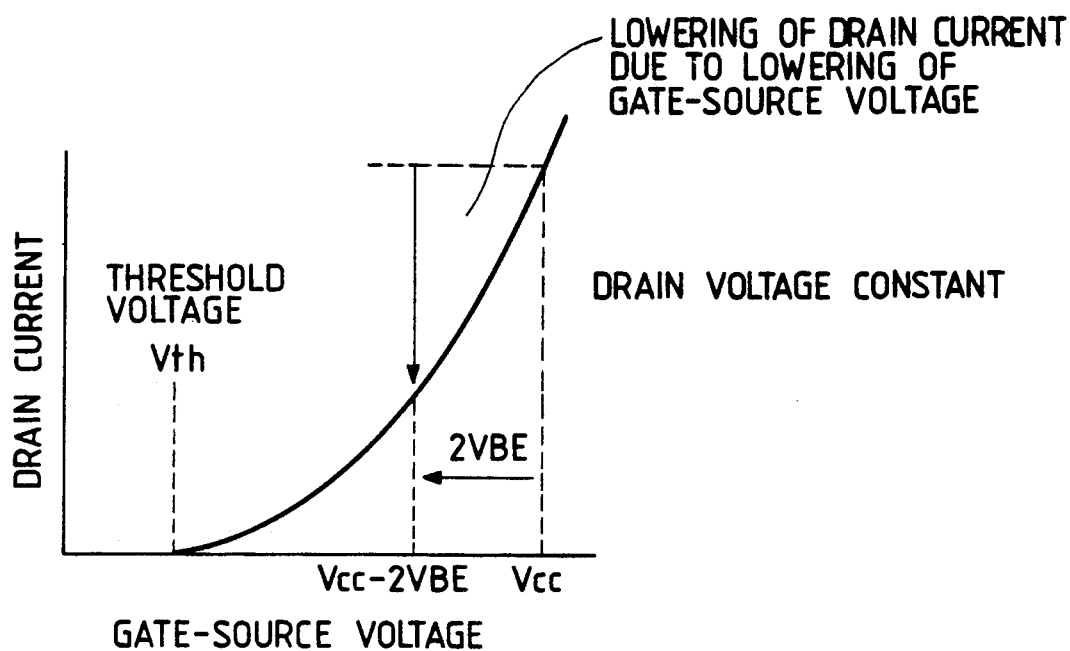
FIG. 3 is a diagram of characteristics showing the dependency of drain current of a MOSFET upon the gate-source voltage.
Figure 5:
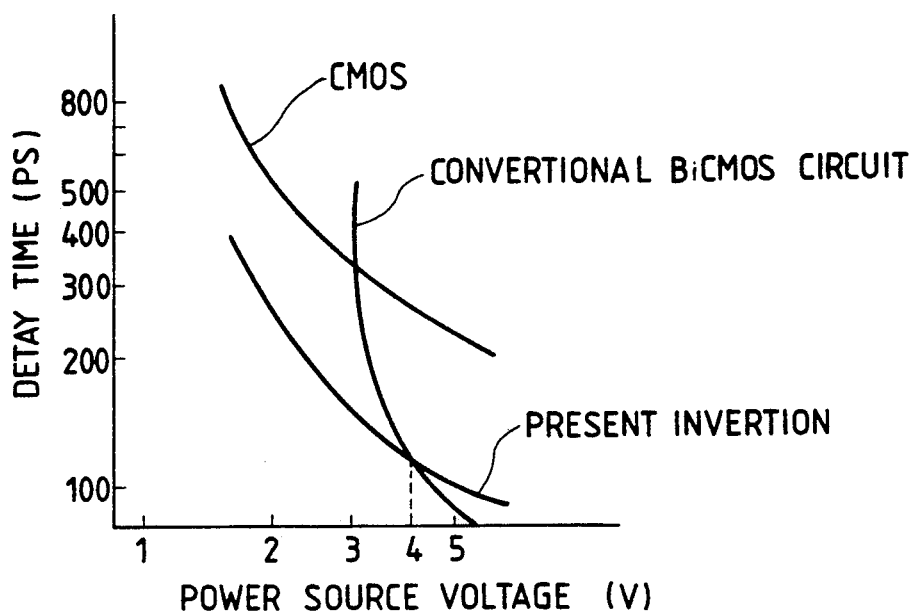
FIG. 5 is a diagram of characteristics showing the dependency of delay time of the two-input NAND circuit of the first embodiment shown in FIG. 1 in comparison with that of the conventional CMOS circuit and BiCMOS circuit.

FIG. 5 shows the dependency of delay time of a CMOS circuit, of a conventional BiCMOS circuit and of the two-input BAND gate of the embodiment of FIG. 1 of the present invention upon the power source voltage. When the power source voltage is greater than 4 volts, the conventional BiCMOS circuit of FIG. 2 operates fastest and the present invention operates rather slow. When the voltage is smaller than 4 volts, the conventional BiCMOS circuit of FIG. 2 exhibits a delay time that increases suddenly, while the present invention operates at the fastest speed which is about twice as fast as the CMOS circuit. Therefore, the present invention is effective for increasing the operation speed when it is attempted to operate the BiCMOS circuit on a power source voltage of lower than 4 volts.

The breakdown voltage is about 4 volts that is determined by the element deteriorated by hot carriers of the n-channel MOSFET that has a gate length of 0.5 microns. The breakdown voltage becomes smaller than 4 volts when the MOSFET has a gate length shorter than the above value. Therefore, the present invention is particularly effective for the BiCMOS integrated circuit that uses the MOSFETs having a gate length shorter than 0.5 microns.

EMBODIMENT 2

Figure 6:
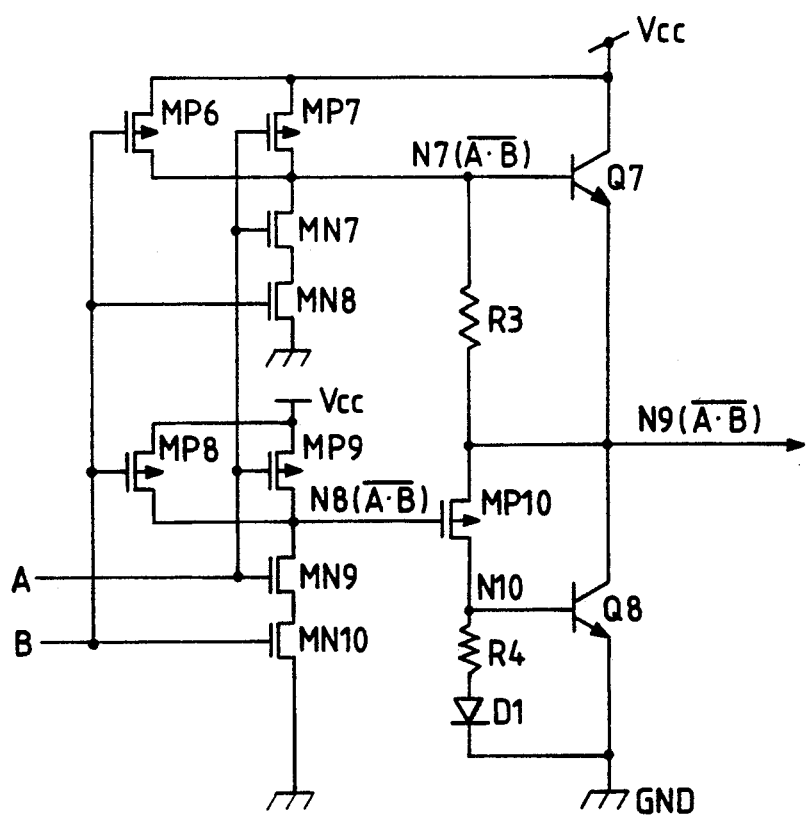
FIG. 6 is a circuit diagram of the two-input NAND gate according to a second embodiment of the present invention.

FIG. 6 shows the two-input NAND circuit according to a second embodiment of the present invention.

What makes the embodiment of FIG. 6 different from the first embodiment of FIG. 1 is that the base terminal N7 of the bipolar transistor Q7 is separated from the gate terminal N8 of the p-channel MOSFET MP10, and the base terminal N7 and the gate terminal N8 are driven by independent CMOS NAND gate circuits (MP6, MP7, MN7, MN8; MP8, MP9, MN9, MN10).

These CMOS NAND gate circuits (MP6, MP7, MN7, MN8; MP8, MP9, MN9, MN10) produce NAND outputs of the input signals A and B on the terminal N7 and N8, and perform the same logic operation as that of the first embodiment shown in FIG. 1. It is therefore obvious that the NAND output of inputs A and B is produced on the output terminal N9.

In order to turn the upper-side transistor Q7 on at a high speed in response to a change from high into low of either one of the input A or the input B, the logical threshold voltage of the upper-side CMOS NAND gate circuit (MP6, MP7, MN7, MN8) must be set to a value which is greater than Vcc/2. In order to set this logical threshold voltage in the upper-side CMOS NAND gate circuit, the gate widths of the p-channel MOSFETs MP6 and MP7 are set to large values and the gate widths of the n-channel MOSFETs MN7 and MN8 are set to small values. Further, since the n-channel MOSFETs MN7 and MN8 have small gate widths, the crossover current flowing into the upper-side CMOS NAND gate circuit becomes small.

In order to turn the lower-side transistor Q8 on at a high speed in response to a change from low to high of the two inputs A and B, the logical threshold voltage of the lower-side CMOS NAND gate circuit (MP8, M9, MN9, MN10) must be set to a value which is smaller than Vcc/2. In order to set this logical threshold voltage in the lower-side CMOS NAND gate circuit, the gate widths of the n-channel MOSFETs MN9 and MN10 are set to large values and the gate widths of the p-channel MOSFETs MP8 and MP9 are set to small values. Further, since the p-channel MOSFETs MP8 and MP9 have small gate widths, the crossover current flowing into the lower-side CMOS NAND gate circuit becomes small.

In the embodiment of FIG. 6, when it is presumed that either one of the input A or the input B remains high and the other one changes from low into high, the crossover current that flows from the power source voltage Vcc into the node N8 through MP8 or MP9 of a small gate width becomes very smaller than that of the case of the embodiment 1 shown in FIG. 1. The transistors MN9 and MN10 having a large gate width, on the other hand, release the electric charge from the node N8 at high speeds.

Similarly, considered below is the case where either one of the input A or the input B remains high and the other one changes from high into low. The node N7 is electrically charged from the power source voltage Vcc through MP6 or MP7 having a large gate width. At this moment, a current that flows from the node N7 into ground potential via MN7 and MN8 having a small gate width becomes very smaller than that of the case of the embodiment 1 of FIG. 1, and the node N7 is electrically charged at a high speed.

Moreover, the embodiment shown in FIG. 6 is different from the embodiment of FIG. 1 with respect to that a diode D1 is connected in series with the resistor R4. The forward voltage $V_F$ of the diode D1 is from about 0.3 V to about 0.6 V.

Therefore, when the node N8 changes from high into low (i.e., when the node N10 is electrically charged through MP10), the node N10 can be electrically charged within short periods of time to a potential of about 0.8 V at which the transistor Q8 is turned on since the potential $V_F$ exists already at the node N10, and the circuit operates at high speeds.

Even in the embodiment of FIG. 6, when the inputs A and B are maintained high or low as in the embodiment 1 of FIG. 1, the transistors Q7, Q8 and MP10 all remain turned off. At this moment, the node N10 assumes the forward voltage $V_F$ of the diode D1.

In the embodiment of FIG. 6, for instance, if MP6, 7, and MN9, 10 have a gate width of 10 microns, then MN7 and 8 have a gate width of about 4 microns, and MP8 and 9 have a gate width of about 2 microns.

Any element can be used as the diode D1 provided it works as a constant-voltage source. Further, the diode portion may be replaced by any constant-voltage circuit.

Owing to the above-mentioned two points, the embodiment shown in FIG. 6 operates at a speed about 1.3 times faster than that of the first embodiment shown in FIG. 1.

EMBODIMENT 3

A third embodiment of the present invention will now be described in conjunction with FIG. 7, which illustrates a two-input NAND circuit of the present invention that is capable of operating at high speeds on a low power source voltage.

Symbols A and B denote input signals to the NAND gate, MN11 and MN12 denote n-channel MOSFETs, MP11, MP12 and MP13 denote p-channel MOSFETs, Q9 and Q10 denote npn bipolar transistors, R5 denotes a resistor, and D2 denotes a diode. The diode D2 has a forward voltage $V_F$ of about 0.3 V to about 1 V. Diodes having a small $V_F$ may be connected in a number of two in series.

What makes this embodiment different from the embodiment 1 is that the diode D2 is connected between a node N11 and a node N12, and that no resistor is connected across the base and the emitter of Q9. In this embodiment in which no resistance is connected across the base and the emitter of Q9, the high level at the output node N13 becomes lower than Vcc by the on-voltage $V_{BE}$. Further, the low level at N11 becomes higher than ground potential by $V_F$ due to the diode D2. Similarly, the high level at N12 becomes lower than Vcc by $V_F$. However, the logical operation here is the same as that of the embodiment 1 that is shown in FIG. 1.

Figure 7:
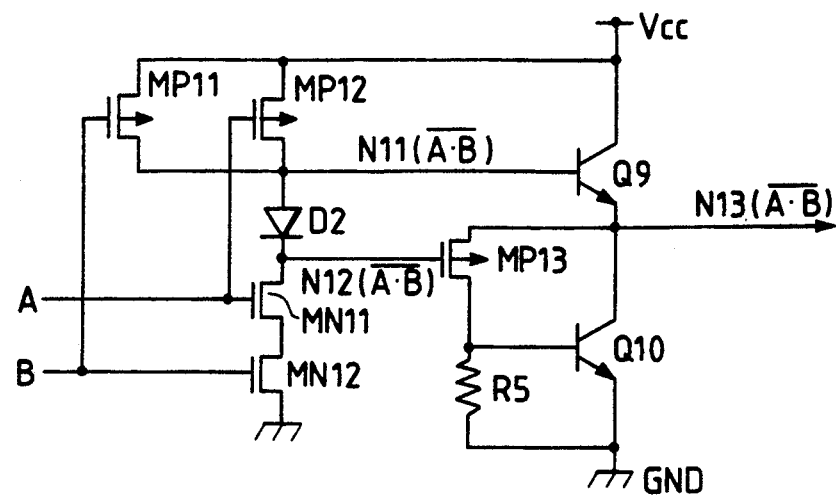
FIG. 7 is a circuit diagram of the two-input NAND gate according to a third embodiment of the present invention.

In the embodiment of FIG. 7, the drain-source voltage applied to all of the MOSFETs becomes a maximum of $Vcc - V_F$, whereby it is allowed to use MOSFETs having a small breakdown voltage contributing to reducing the size. Moreover, since the input/output terminals N11 and N12 operate with a voltage amplitude of $Vcc - V_{BE}$ or $Vcc - V_F$, the consumption of electric power becomes smaller than that of the circuit of the embodiment 1 of FIG. 1.

In the embodiment 3, the diode D2 working as a level-shifting element can be replaced by any one of SBD (Schottky barrier diode), pn-junction diode, MOS diode, or resistor, as will be described later in conjunction with FIG. 13(B).

EMBODIMENT 4

A fourth embodiment of the present invention will now be described with reference to FIG. 8 which shows a two-input NAND circuit of the present invention that is capable of operating at high speeds on a low power source voltage.

Symbols MN13-18 denote n-channel MOSFETs, MP14-18 denote p-channel MOSFETs, Q11 and Q12 denote npn bipolar transistors, and symbol D3 denotes a diode.

Further, two CMOS inverters C1 and C2 are connected between the nodes N16 and N17 in a cross-coupled manner.

Figure 8:
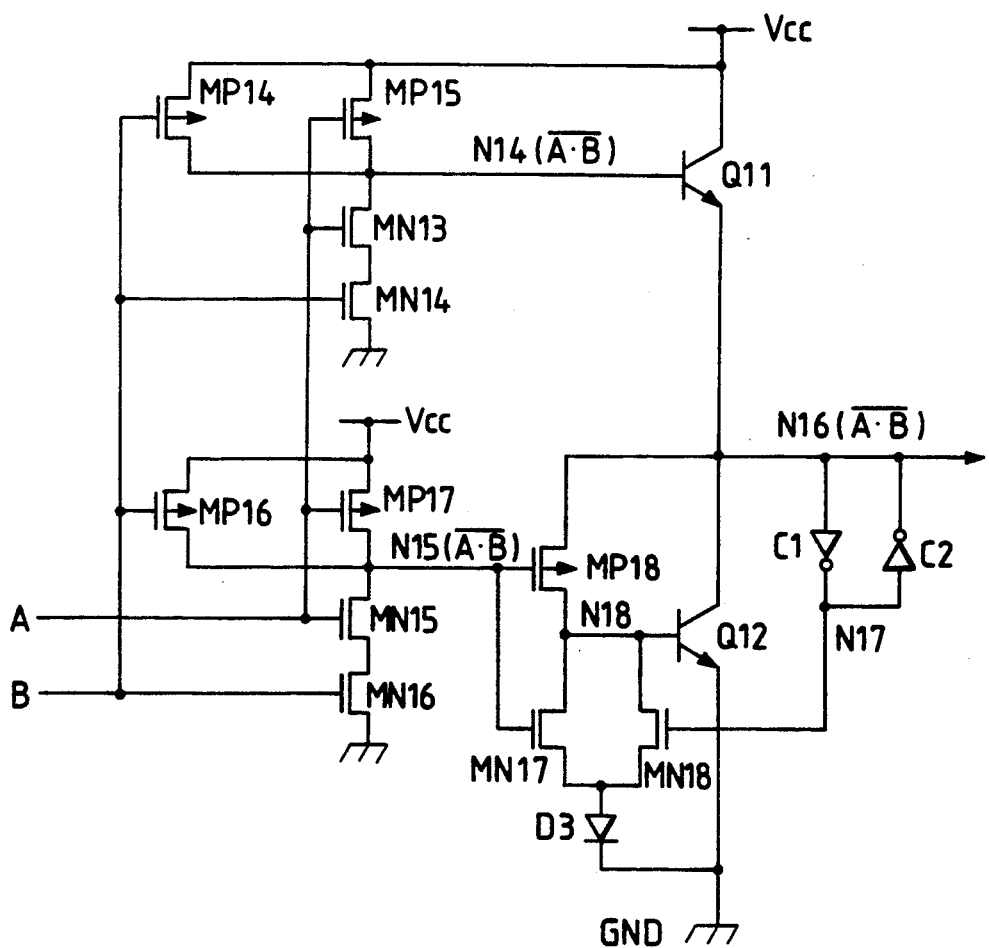
FIG. 8 is a circuit diagram of the two-input NAND gate according to a fourth embodiment of the present invention.
Figure 9:
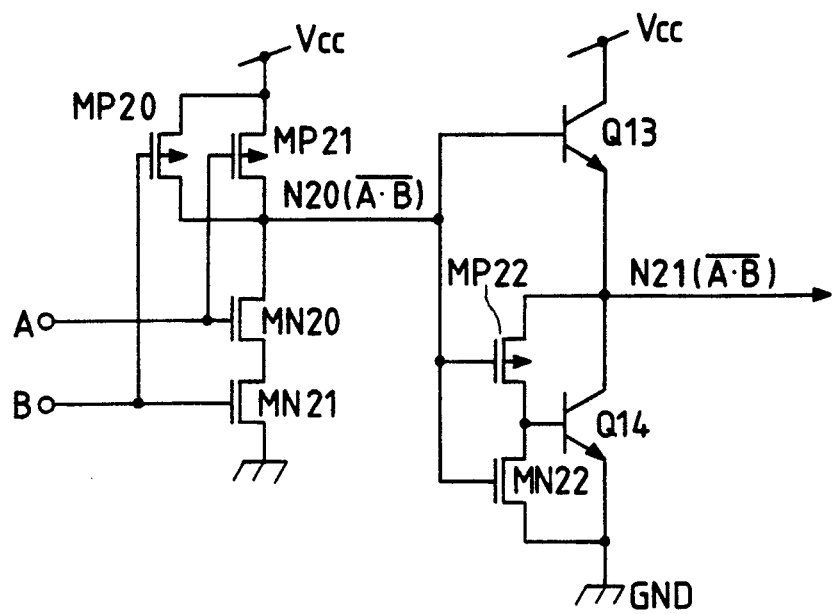
FIG. 9 is a circuit diagram of a two-input NAND gate based on a conventional BiCMOS circuit.

Therefore, the embodiment shown in FIG. 8 is different from the embodiment 2 of FIG. 6 with respect to that there is used no resistor R3 that was used in FIG. 6, that the cross-coupled CMOS inverters C1 and C2 are added, and that the n-channel MOSFETs MN17 and EN18 are used instead of the resistor R4 of FIG. 6. Therefore, the basic logical operation of the embodiment shown in FIG. 8 is quite the same as that of the embodiment 2 of FIG. 6.

When a node N14 changes from low into high, a node N16 is electrically charged to $Vcc - V_{BE}$ through Q11. Owing to this charging operation, the output N17 of the CMOS inverter C1 becomes nearly equal to ground level, and a node N16 finally assumes Vcc being charged through the CMOS inverter C2. Therefore, though there is used no resistor R3 that was used in the embodiment 2 of FIG. 6, the node N16 assumes the high level of Vcc.

Described below is the operation of the transistors MN17 and MA18 which draw the base charge from the bipolar transistor Q12, so that no current flows into the bipolar transistor Q12 under the steady state. When the input B changes from low into high while the input A is remaining at the high level, the node N15 changes from high into low. Therefore, the p-channel MOSFET MP18 is turned on to electrically charge the base potential N18 of the transistor Q12 which is then turned on. The electric charge of the output terminal N16 is released through Q12; i.e., the output terminal N16 assumes the low level. Then, the node N17 is charged by the CMOS inverter C1 to assume the high level, and MN18 is turned on. The base charge of Q12 is released via MN18, and the node N18 assumes a level higher than the ground level by the forward voltage $V_F$ of the diode D3. When $V_F$ is smaller than 0.6 V, a small current flows into Q12 under the steady state.

Next, considered below is the case where the input B changes from high into low. At this moment, the node N15 changes from low into high, and MN17 is turned on. Therefore, the transistor Q12 remains turned off. At this moment, N14 and N16 become high but Q12 remains turned off. Therefore, the transistor Q12 remains turned off except under the transient condition in which the node N15 changes from high into low.

EMBODIMENT 5

A fifth embodiment of the present invention will be described with reference to FIG. 10 which shows a two-input NAND circuit of the present invention that is capable of operating at high speeds on a low power source voltage. Symbols MN23 to 27 denote n-channel MOSFETs, MP23 to 27 denote p-channel MOSFETs, Q15 and Q16 denote npn bipolar transistors, and C3 denotes a CMOS inverter.

Figure 10:
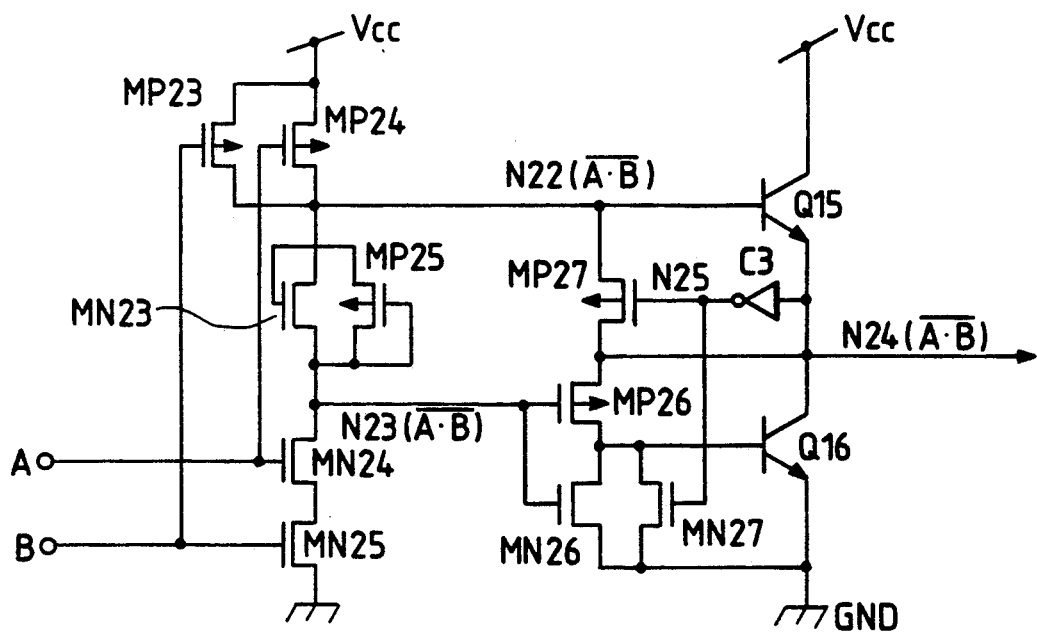
FIG. 10 is a circuit diagram of the two-input NAND gate according to a fifth embodiment of the present invention.

The embodiment shown in FIG. 10 is different from the embodiment 1 of FIG. 1 with respect to that the MOSFETs MN23 and MP25 whose gate terminals are connected to the drain are connected between a node N22 and a node N23, and that the resistors R1 and R2 of FIG. 1 are replaced by the MOSFETs MP27, MN26 and MN27 that operate as active resistors. Therefore, the basic logical operation is quite the same as that of the embodiment 1 of FIG. 1.

Considered below is the case where the node N23 is discharged and changes from high into low. At this time, the transistors MN23 and MP25 are turned on transiently to release the electric charge from N22. However, as the potential at N22 becomes equal to the threshold voltage of MN23, MN23 becomes turned off. Therefore, the low level at N22 assumes a potential which is higher than ground potential by the threshold voltage. On the other hand, MP25 is turned off before N22 assumes the low level. This is because, the source potential of MP25 is lower than the power source voltage Vcc, and a substrate bias is applied between the source and the substrate causing the threshold value (absolute value) to increase.

Considered below is the case where N22 changes from low into high in response to a change in the input. Due to MN23 and MP25, in this case, the node N22 is assuming a potential higher than ground potential and, hence, the base terminal of Q15 is electrically charged within short periods of time and is turned on, enabling the circuit to operate at high speeds.

As the node N22 assumes the power source potential, the node N23 becomes high. As the node N23 assumes a potential which is lower than the power source potential by the threshold voltage (absolute value) of MP25, then MP25 is turned off establishing a high level for the node N23.

Next, considered below is the case where N23 changes from high into low. The node N23 is assuming a potential which is lower than the power source potential Vcc due to MN23 and MP25. Therefore, the transistors MP26 and Q16 are turned on within very short periods of time, the discharge operation is started at the output node N24 and high-speed operation is realized.

As described below, the transistors MN23 and MP25 also work to suppress the crossover current enabling the operation speed to increase and the consumption of electric power to decrease. That is, a case is considered below in which the input A is assuming the high level and the input B changes from low into high. In this case, MN24 and MN25 are both rendered conductive and N23 becomes low. A crossover current flows from the power source terminal Vcc into the MN24 and MN25 via MN23 and MP25 in addition to a current that releases the charge stored at N23. This crossover current is a idle current which decreases the operation speed. According to this embodiment, therefore, MN23 and MP25 are comprised of MOSFETs having a small gate width in order to decrease the crossover current. Therefore, the operation speed is higher than that of the first embodiment, and the consumption of electric power is small since the crossover current is small.

The high-speed operation is obtained consuming reduced amount of electric power even when MN25 and MP25 are replaced by resistors. The same effects are also obtained even when there are used diodes or diodes and resistors that are connected in series.

The transistors MN26 and MN27 operate in the same manner as the transistors MN17 and MN18 of the embodiment 4 of FIG. 8, and their description is not repeated here.

Next, described below is the operation of MP27. A case is now considered where the node N22 changes from low into high. When the node N22 is low, the node N24 is low too and the output N25 of the CMOS inverter C3 becomes high. Therefore, MP27 is turned off. The transistors MP27 remains turned off even after the potential at the node N22 starts to rise from low into high, and the current for charging the node N22 is used for efficiently charging the base of the transistor Q15. When the node N22 assumes the power source potential Vcc, the output node N24 is charged to Vcc−$V_{BE}$ via Q15. When the charging up to the level Vcc−$V_{BE}$ is completed, the output node N25 of the CMOS inverter C3 assumes nearly ground level. Therefore, the transistor MP27 is turned on, and the output node N24 is charged to Vcc via MP27.

This embodiment is adapted to being highly densely integrated since the number of MOSFETs is smaller than that of the embodiment 4 shown in FIG. 8.

EMBODIMENT 6

A sixth embodiment of the present invention will be described with reference to FIG. 11 which shows a two-input NAND circuit of the present invention that operates at high speeds on a low power source voltage. Symbols MN28–32 denote n-channel MOSFETs, MP28–33 denote p-channel MOSFETs, Q17 and Q18 denote npn bipolar transistors, and C4 denotes a CMOS inverter.

Figure 11:
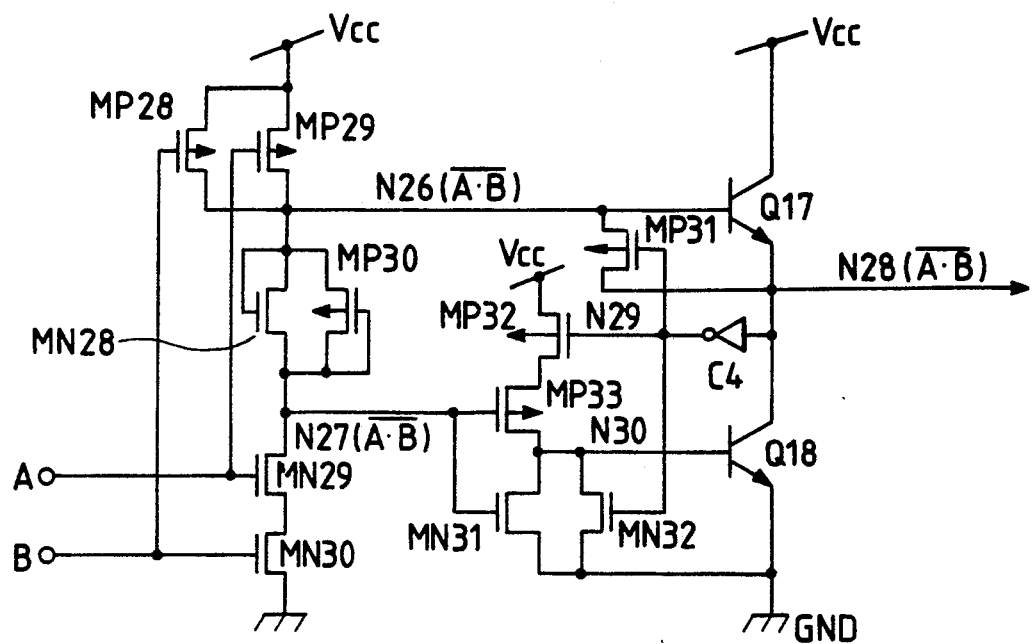
FIG. 11 is a circuit diagram of the two-input NAND gate according to a sixth embodiment of the present invention.

The sixth embodiment of the present invention shown in FIG. 11 is basically different from the embodiment 5 of FIG. 10 with respect to that the p-channel MOSFETs MP32 and MP33 are connected in series between the power source Vcc and the base of the bipolar transistor Q18 to electrically charge the base terminal of the bipolar transistor Q18. The circuit constitution in other respects and the circuit operation are basically the same as the embodiment 5 of FIG. 10, and their detailed description is not repeated here but characteristic differences in the circuit operation are described.

In the circuit connection of the embodiment 5 of FIG. 10, when the node N23 changes from high into low, the node N24 changes from high into low correspondingly and the drain current of the p-channel MOSFET decreases. In order to prevent this according to the sixth embodiment of the present invention shown in FIG. 11, the current drivability of the p-channel MOSFET is increased in order to further increase the speed of operation.

That is, in the sixth embodiment of the present invention shown in FIG. 11, an operation is considered in which the node N27 changes from high into low. When the node N27 is high, the output N28 is high and N29 is low. Therefore, MP32 is on and MP33 is off. Accordingly, a current path consisting of MP32 and MP33 is off. At this moment, since MN31 is on, N30 is low and Q18 is off. When the node N27 is discharged and changes from high into low due to a change in the input, the transistor MP33 is turned on, a current path consisting of MP32 and MP33 is turned on, and N30 is discharged. Therefore, the transistor Q18 is turned on and the node N28 is discharged. The node N28 therefore changes into low. However, the node N29 does not readily become high since the CMOS inverter C4 has a delay time. Accordingly, the transistor MP32 remains on during that period. The transistor MP32 therefore supplies a sufficiently large amount of electric charge to the base of the transistor Q18 which therefore permits a large collector current to flow. This embodiment therefore is adapted to operating at high speeds.

EMBODIMENT 7

A seventh embodiment of the present invention will now be described with reference to FIG. 12 which shows a two-input NAND circuit of the present invention that is capable of operating at high speeds on a low power source voltage. Symbols MN33–36 denote n-channel MOSFETs, MP34–39 denote p-channel MOSFETs, Q19 and Q20 denote npn bipolar transistors, and C5 denotes a CMOS inverter.

Figure 12:
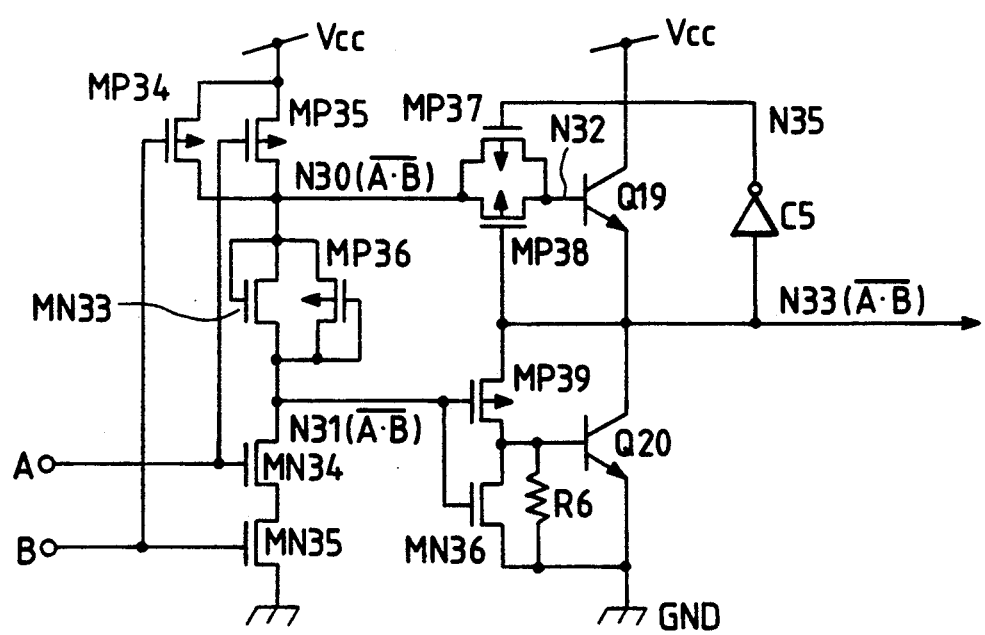
FIG. 12 is a circuit diagram of the two-input NAND gate according to a seventh embodiment of the present invention.

The seventh embodiment of the present invention shown in FIG. 12 is different from the embodiment 5 of FIG. 10 with respect to that the transistors MP37 and MP38 are not connected to the base terminal of the transistor Q19 and that the resistor R6 is used instead of the transistor MN27 of FIG. 10. The resistor R6 is a passive one which substitutes for the active resistor of MOSFET MN27 of FIG. 10, and operates quite in the same manner.

Next, operation of the transistors MP37, MP38 will be described. In the embodiment 5 of FIG. 10, the bipolar transistor Q15 is turned off when the potential at the output terminal N24 rises to Vcc−$V_{BE}$ during the operation for pulling up the output terminal N24. The potential is pulled up to Vcc by short-circuiting the base and emitter of the transistor Q15 using the p-channel MOS transistor MP27 whose on-resistance cannot be neglected. Therefore, the rise of potential at the node N24 becomes loose thereafter. The voltage applied across the gate and the source of the n-channel MOSFET in the BiCMOS gate circuit in the next stage becomes effectively Vcc−$V_{BE}$.

In the embodiment of FIG. 12, when the output N33 becomes $V_{cc}-V_{BE}$, the transistor MP38 is turned off or assumes the condition of high resistance. The transistor Q19 remains turned on since there is no discharge path for the electric charge stored in the base of the transistor Q19. Therefore, the transistor Q19 permits the collector current to flow continuously until the output N33 assumes Vcc. This embodiment is more adapted to being operated at high speeds than the embodiment 5 of FIG. 10. This effect becomes conspicuous when the power source voltage Vcc is low.

As the output terminal N33 assumes the power source voltage Vcc, the base terminal N32 is boosted to a level $V_{cc}+V_{BE}$ and the electric charge remains stored in the base of the transistor Q19. After the output N33 becomes high, therefore, the node N35 becomes low being delayed by the delay time of the CMOS inverter C5 and the p-channel MOSFET MP37 is turned on. Therefore, the base charge of Q19 is released and the potential at the output N32 decreases to Vcc. If this discharge operation is not carried out, a large crossover current flows from Vcc via Q19 and Q20 in the next pull-down operation, and the operation speed becomes slow and the consumption of electric power increases.

The transistor MP37 may be replaced by a resistor or by any other element that can be equivalently regarded to be a resistor.

In the foregoing embodiments, the present invention was described by using the two-input NAND gate. It will, however, be obvious that the logic gate constituted by a known CMOS circuit such as an inverter, a NOR gate, a composite NAND/NOR gate, a path transistor or a clocked inverter can be directly adapted to the present invention without departing from the scope of the present invention.

In the embodiments 1, 2, 3 and 7, the resistors R1-p R6 may be replaced by the MOSFETs that perform nearly equivalent operation without departing from the scope of the present invention.

Figure 13A:
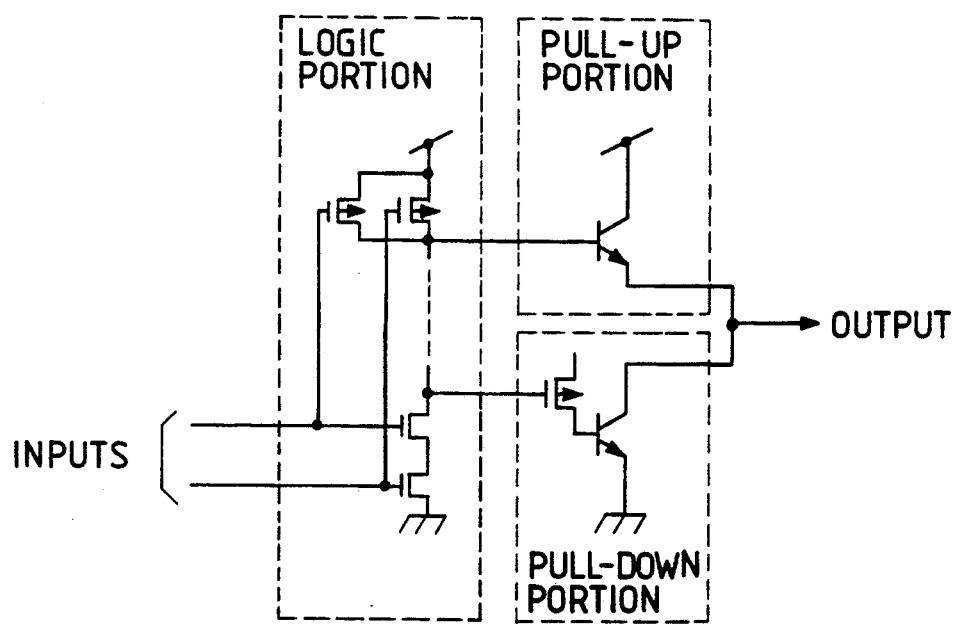
Figure 13B:
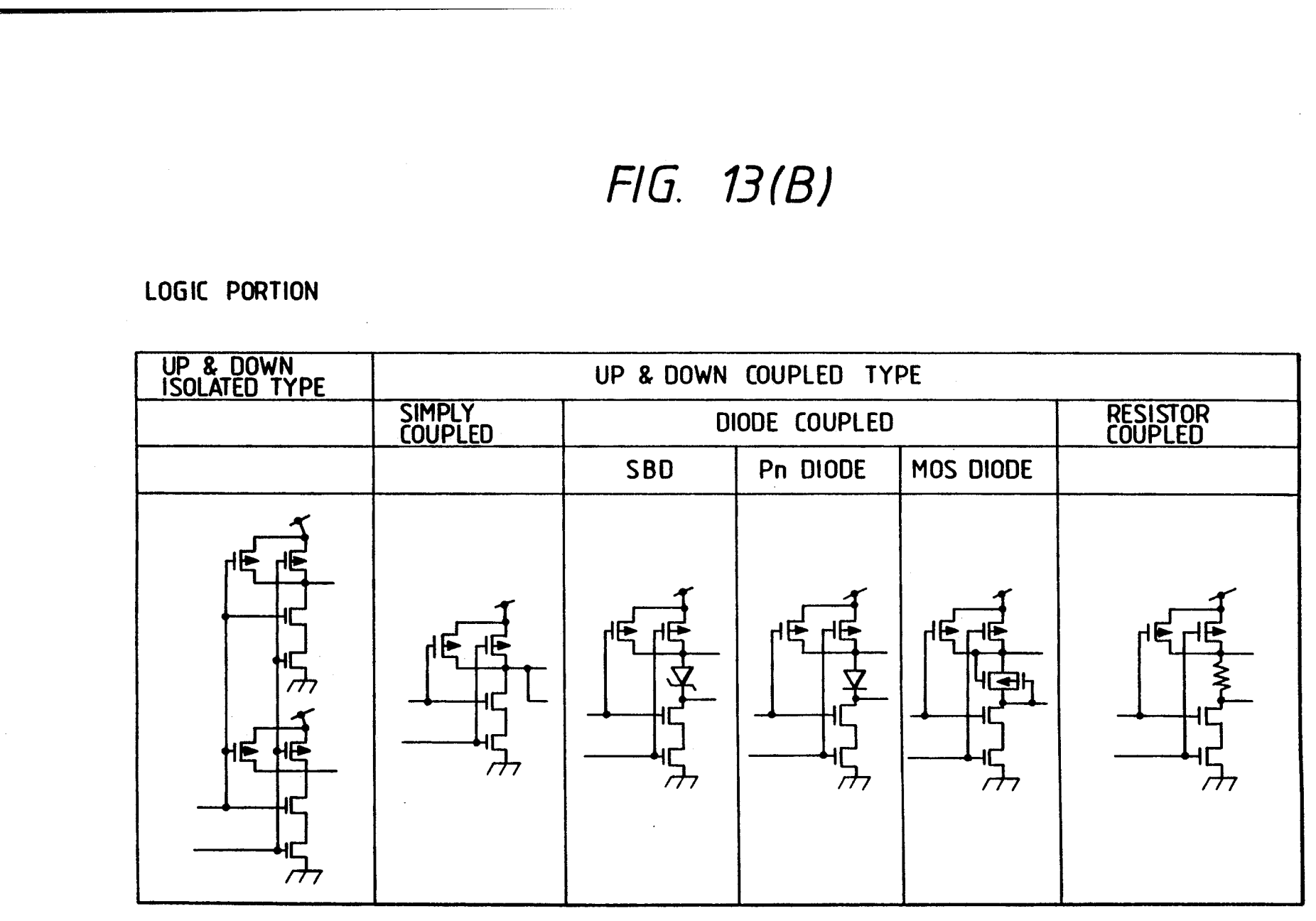
Figure 13C:
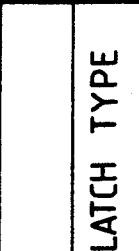
Figure 13D:
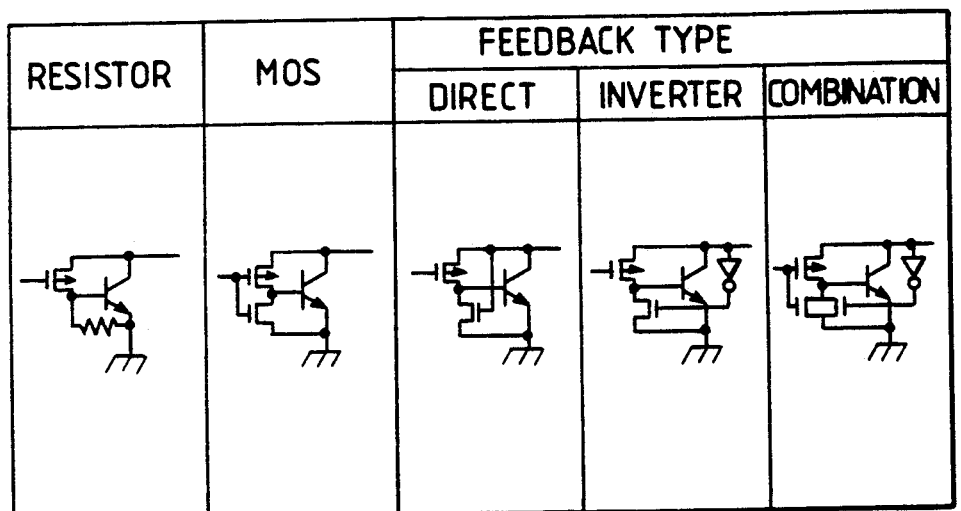
Figure 13D:
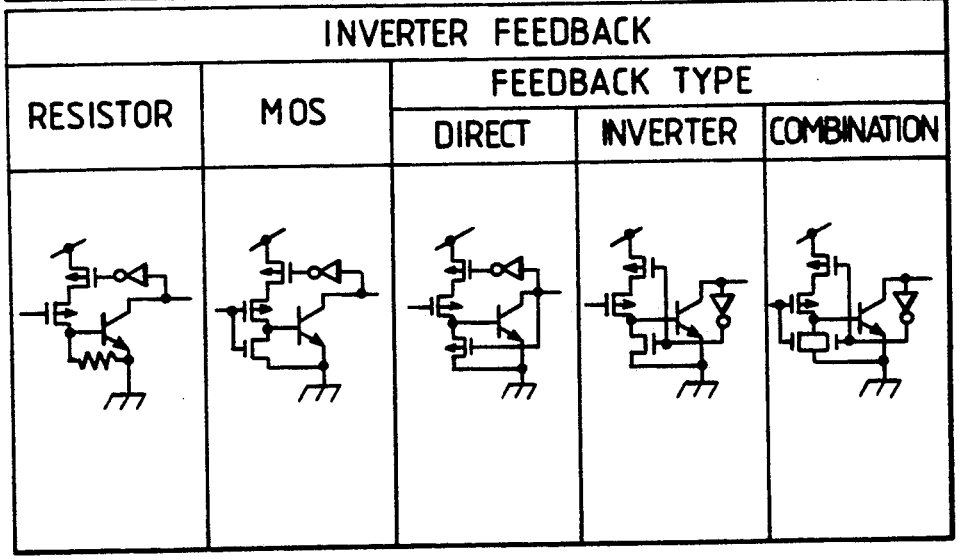

Representative examples of the aforementioned circuit constitutions can be summarized as shown in FIGS. 13(A), 13(B), 13(C) and 13(D). As shown in FIG. 13(A), the present invention consists of a logic portion, a pull-up portion and a pull-down portion. The logic portion consists of a circuit that is shown in FIG. 13(B). The pull-up portion consists of a circuit that is shown in FIG. 13(C). The pull-down portion consists of a circuit shown in FIG. 13(D). These circuits are arbitrarily combined together to constitute the present invention.

According to the present invention, there is realized a BiCMOS logic circuit that operates at high speeds on a power source voltage of smaller than 4 volts, that was not possible so far. The amount of electric power consumed by the BiCMOS circuit varies in proportion to the second power of the power source voltage. The present invention makes it possible to realize a logic circuit that operates consuming the electric power in amounts very smaller than that of the prior art. Furthermore, since the bipolar transistors are used in the output portion, the circuit can be operated at high speeds even when the load capacity is great.

With the MOSFETs having a gate length of shorter than 0.5 microns, the voltage applied across the drain and the source must be smaller than 4 volts in order to avoid deterioration by hot carriers. So far, therefore, the BiCMOS integrated circuit using MOSFETs with a gate length of shorter than 0.5 microns could not be operated at high speeds. The present invention, however, made it possible to realize the high-speed operation yet consuming a small amount of electric power and, therefore, to realize memories and microprocessors that operate at high speeds in small sizes as well as to reduce the consumption of electric power, presenting vary great industrial values.

What is claimed is:

1. A logic circuit comprising:
    a first npn transistor of which a collector-emitter path thereof is connected between a first operating potential and an output terminal; and
    a second npn transistor of which a collector-emitter path thereof is connected between said output terminal and a second operating potential,
    wherein a voltage difference applied between said first operating potential and said second operating potential is set to be smaller than 4 volts;
    a first switching circuit including a p-channel insulated gate FET is connected between said first operating potential and a base of said first npn transistor; and
    a second switching circuit including a p-channel insulated gate FET is connected between said output terminal and a base of said second npn transistor,
    wherein said p-channel insulated gate FET of said first switching circuit and the p-channel insulated gate FET of said second switching circuit each have a gate coupled to respond to a signal at an input node of said logic circuit,
    and wherein the p-channel insulated gate FETs of said first switching circuit and said second switching circuit have gate lengths shorter than 0.5 micron.

2. A logic circuit according to claim 1, wherein a resistor or a similar circuit element that equivalently operates as a resistor is connected between the base and an emitter of said first npn transistor.

3. A logic circuit according to claim 1, wherein a third switching circuit includes a p-channel insulated gate FET connected between said first operating potential and the gate of said p-channel insulated gate FET of said second switching circuit.

4. A logic circuit according to claim 3, wherein said p-channel insulated gate FET of said third switching circuit has a gate of a width smaller than that of said p-channel insulated gate FET of said first switching circuit.

5. A logic circuit according to claim 1, wherein a resistor or a similar circuit element that equivalently operates as a resistor is connected between the base of said second npn transistor and said second operating potential.

6. A logic circuit according to claim 1, further including a resistor connected across the base and emitter of said first npn transistor.

7. A logic circuit according to claim 1, further including an insulated gate FET having a source-drain path coupled across the base and emitter of said first npn transistor and being controlled in conduction in response to the potential at said output terminal.

8. A logic circuit according to claim 1, further including a resistor connected across the base and emitter of said second npn transistor.

9. A logic circuit according to claim 1, further including a resistor connected across the base and emitter of said first npn transistor.

10. A logic circuit comprising:

a first npn transistor of which an emitter-collector path thereof is connected between a first operating potential and an output terminal;

a second npn transistor of which an emitter-collector path thereof is connected between said output terminal and a second operating potential, wherein a voltage difference applied between said first operating potential and said second operating potential is set to be smaller than 4 volts;

a first switching circuit including a p-channel insulated gate FET is connected between said first operating potential and a base of said first npn transistor;

a first p-channel insulated gate field gate FET being connected with said second npn transistor for electrically charging a base of said second npn transistor to a high logic level;

a second switching circuit including an n-channel insulated gate FET having a source-drain path connected between a gate of said first p-channel insulated gate FET and said second operating potential; and a third switching circuit including an n-channel insulated gate FET having a source-drain path connected between the base of said first npn transistor and said second operating potential, wherein said p-channel insulated gate FET of said first switching circuit and the n-channel insulated gate FETs of said second and third switching circuits each have a gate coupled to respond to a signal at an input node of said logic circuit, and wherein said first p-channel insulated gate FET, said p-channel insulated gate FET of said first switching circuit and the n-channel insulated gate FETs of said second and third switching circuits have gate lengths shorter than 0.5 micron.

11. A logic circuit comprising:

a pull-up element connected between a first operating potential and an output terminal;

an npn transistor of which a collector-emitter path thereof is connected between said output terminal and a second operating potential;

first and second p-channel insulated gate FETs of which source-drain paths are connected in series between said first operating potential and a base of said npn transistor; and an inverter having an input coupled to respond to a signal from said output of said logic circuit, and having an output terminal;

wherein an input signal is supplied to a gate of said first p-channel insulated gate FET, an output signal at the output of said inverter is supplied to a gate of said second p-channel insulated gate FET, and a change from a high logic level into a low logic level of said output terminal in response to a change from a high logic level into a low logic level of said input signal is transmitted to the gate of said second p-channel insulated gate FET as a change from a low logic level into a high logic level of said output signal of said inverter after a delay time of said inverter, wherein a voltage difference applied between said first operating potential and said second operating potential is set to be smaller than 4 volts, and wherein said first and second p-channel insulated gate FETs have gate lengths shorter than 0.5 micron.

12. A logic circuit comprising:

a first npn transistor of which an emitter-collector path thereof is connected between a first operating potential and an output terminal;

a second npn transistor of which an emitter-collector path thereof is connected between said output terminal and a second operating potential, wherein a voltage difference applied between said first operating potential and said second operating potential is set to be smaller than 4 volts;

a first switching circuit including a p-channel insulated gate FET is connected between said first operating potential and a base of said first npn transistor;

a first p-channel insulated gate field gate FET being connected with said second npn transistor for electrically charging a base of said second npn transistor to a high logic level;

a second switching circuit including an n-channel insulated gate FET having a source-drain path connected between a gate of said first p-channel insulated gate FET and said second operating potential; and a third switching circuit including a p-channel insulated gate FET having a source-drain path connected between said first switching circuit and the base of said first npn transistor, and said p-channel insulated gate FET of said third switching circuit having a gate coupled to respond to a signal from said output terminal, wherein said p-channel insulated gate FET of said first switching circuit and said n-channel insulated gate FET of said second circuit each having a gate coupled to respond to a signal at an input node of said logic circuit, and wherein said first p-channel insulated gate FET, the p-channel insulated gate FETs of said first and third switching circuits and said n-channel insulated gate FET of said second switching circuit have gate lengths shorter than 0.5 micron.

13. A logic circuit according to claim 12, wherein said third switching circuit further includes another p-channel insulated gate FET connected in parallel with the source-drain path of said p-channel insulated gate FET thereof, said another p-channel insulated FET having a gate coupled to respond to an inverted signal of said output terminal.

14. A logic circuit comprising:

a first npn transistor of which an emitter-collector path thereof is connected between a first operating potential and an output terminal;

a second npn transistor of which an emitter-collector path thereof is connected between said output terminal and a second operating potential, wherein a voltage difference applied between said first operating potential and said second operating potential is set to be smaller than 4 volts;

a first switching circuit including a p-channel insulated gate FET is connected between said first operating potential and a base of said first npn transistor;

a first p-channel insulated gate FET being connected with said second npn transistor for electrically charging a base of said second npn transistor to a high logic level;

a second switching circuit including an n-channel insulated gate FET having a source-drain path connected between a gate of said first p-channel insulated gate FET and said second operating potential; and providing an electrical connection of the base of said first npn-transistor and the gate of said first p-channel insulated gate FET via any one of a diode, a resistor, or a similar circuit element, wherein said p-channel insulated gate FET of said first switching circuit and said n-channel insulated gate FET of said second circuit each have a gate coupled to respond to a signal at an input node of said logic circuit, and wherein said first p-channel insulated gate FET, said p-channel insulated gate FET of said first switching circuit and said n-channel insulated gate FET of said second switching circuit have gate lengths shorter than 0.5 micron.

15. A logic circuit according to claim 14, wherein the electrical connection of the base of said first npn transistor and the gate of said first p-channel insulated gate FET is via a diode.

16. A logic circuit according to claim 14, wherein the electrical connection of the base of said first npn transistor and the gate of said first p-channel insulated gate FET is via a resistor.

17. A logic circuit according to claim 14, wherein the electrical connection of the base of said first npn transistor and the gate of said first p-channel insulated gate FET is via a pair of parallel-connected complementary channel insulated gate FETS, each having a gate connected to a drain thereof.

* * * * *